US012627265B2

(12) United States Patent
Liang

(10) Patent No.: US 12,627,265 B2
(45) Date of Patent: May 12, 2026

(54) METHODS FOR GENERATING A CONSTANT CURRENT

(71) Applicant: Skyworks Solutions, Inc., Irvine, CA (US)

(72) Inventor: Bang Li Liang, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 620 days.

(21) Appl. No.: 18/092,407

(22) Filed: Jan. 2, 2023

(65) Prior Publication Data

US 2023/0216449 A1 Jul. 6, 2023

Related U.S. Application Data

(60) Provisional application No. 63/296,125, filed on Jan. 3, 2022.

(51) Int. Cl.
*H03F 1/30* (2006.01)
*H03F 3/19* (2006.01)

(52) U.S. Cl.
CPC ................ *H03F 1/30* (2013.01); *H03F 3/19* (2013.01); *H03F 2200/447* (2013.01); *H03F 2200/451* (2013.01)

(58) Field of Classification Search
CPC ......................................................... H03F 1/30
USPC ......................................................... 330/289
See application file for complete search history.

(56) References Cited

U.S. PATENT DOCUMENTS

| | | | | |
|---|---|---|---|---|
| 4,345,477 | A | * | 8/1982 | Johnson ................ G01L 1/2281 |
| | | | | 257/419 |
| 5,069,066 | A | * | 12/1991 | Djorup .................... G01F 1/698 |
| | | | | 73/204.18 |
| 6,057,714 | A | | 5/2000 | Andrys et al. |
| 6,639,470 | B1 | | 10/2003 | Andrys et al. |
| 6,731,173 | B1 | | 5/2004 | Thompson |
| 6,917,246 | B2 | | 7/2005 | Thompson |
| 7,443,246 | B2 | | 10/2008 | Andrys et al. |
| 7,576,426 | B2 | | 8/2009 | Gan et al. |
| 7,629,201 | B2 | | 12/2009 | Gan et al. |
| 7,642,135 | B2 | | 1/2010 | Liang |
| 7,726,877 | B1 | * | 6/2010 | Avitan .................. G01K 7/015 |
| | | | | 327/512 |

(Continued)

FOREIGN PATENT DOCUMENTS

| | | |
|---|---|---|
| CN | 110808717 A | 2/2020 |
| CN | 112953413 A | 6/2021 |
| CN | 110808714 B | 7/2023 |

*Primary Examiner* — Henry Choe
(74) *Attorney, Agent, or Firm* — VIA LLP

(57) ABSTRACT

A method for generating a constant current. The method can include receiving an input voltage at a voltage input connected to a resistor pair, the resistor pair including a first resistor and a second resistor, the first resistor having a positive temperature coefficient and the second resistor having a negative temperature coefficient. The first and second resistors can be configured such that the variability of resistance over temperature of the first resistor and the variability of resistance over temperature of the second resistor cancel to produce a zero temperature coefficient for the resistor pair. The method can further include applying the input voltage to the resistor pair to generate a current with a zero temperature coefficient.

20 Claims, 17 Drawing Sheets

(56) References Cited

U.S. PATENT DOCUMENTS

| | | | |
|---|---|---|---|
| 8,482,339 B1 * | 7/2013 | Giuroiu | H03H 11/54 |
| | | | 327/552 |
| 8,803,703 B2 * | 8/2014 | Mitchell | G01D 3/036 |
| | | | 340/870.07 |
| 8,823,444 B2 * | 9/2014 | Fujime | G05F 1/625 |
| | | | 327/542 |
| 8,900,931 B2 | 12/2014 | Liang | |
| 9,153,551 B2 | 10/2015 | Liang | |
| 9,372,222 B2 | 6/2016 | Lee | |
| 10,088,532 B2 | 10/2018 | Ariyama | |
| 10,461,700 B2 | 10/2019 | Liang et al. | |
| 10,554,188 B2 | 2/2020 | Bergsma et al. | |
| 10,693,482 B2 | 6/2020 | Caffee | |
| 10,720,889 B2 | 7/2020 | Liu et al. | |
| 10,838,446 B2 | 11/2020 | Liang et al. | |
| 10,998,862 B2 | 5/2021 | Liang et al. | |
| 11,137,783 B2 | 10/2021 | Liang | |
| 11,256,281 B2 | 2/2022 | Liang | |
| 11,281,247 B2 | 3/2022 | Liang et al. | |
| 11,316,550 B2 | 4/2022 | Liang et al. | |
| 11,327,517 B2 | 5/2022 | Liang et al. | |
| 11,392,159 B2 | 7/2022 | Liang et al. | |
| 11,901,815 B2 | 2/2024 | Li et al. | |
| 2006/0220173 A1 | 10/2006 | Gan et al. | |
| 2007/0070608 A1 | 3/2007 | Warren et al. | |
| 2008/0003761 A1 | 1/2008 | Gan et al. | |
| 2008/0217708 A1 | 9/2008 | Reisner et al. | |
| 2009/0155955 A1 | 6/2009 | Liang | |
| 2010/0007322 A1 * | 1/2010 | Huang | G05F 3/242 |
| | | | 323/312 |
| 2010/0283144 A1 | 11/2010 | Liang | |
| 2014/0159767 A1 | 6/2014 | Lee | |
| 2015/0061125 A1 | 3/2015 | Liang | |
| 2017/0300076 A1 | 10/2017 | Liang et al. | |
| 2018/0138866 A1 | 5/2018 | Liang et al. | |
| 2018/0138877 A1 | 5/2018 | Bergsma et al. | |
| 2019/0158038 A1 | 5/2019 | Beppu | |
| 2020/0007138 A1 | 1/2020 | Caffee | |
| 2020/0021249 A1 | 1/2020 | Liang et al. | |
| 2020/0272182 A1 | 8/2020 | Liang et al. | |
| 2020/0272183 A1 | 8/2020 | Liang | |
| 2020/0401177 A1 | 12/2020 | Liang | |
| 2021/0132642 A1 | 5/2021 | Liang et al. | |
| 2021/0132646 A1 | 5/2021 | Liang et al. | |
| 2021/0218433 A1 | 7/2021 | Liang et al. | |
| 2021/0318708 A1 | 10/2021 | Liang et al. | |
| 2022/0100216 A1 | 3/2022 | Liang | |
| 2022/0253081 A1 | 8/2022 | Liang et al. | |
| 2022/0278707 A1 | 9/2022 | Liang et al. | |
| 2022/0334606 A1 | 10/2022 | Liang | |
| 2022/0350358 A1 | 11/2022 | Liang et al. | |
| 2022/0413533 A1 | 12/2022 | Liang et al. | |
| 2022/0413534 A1 | 12/2022 | Liang et al. | |
| 2023/0012894 A1 | 1/2023 | Liang et al. | |
| 2023/0014555 A1 | 1/2023 | Liang et al. | |
| 2023/0038733 A1 | 2/2023 | Blin | |
| 2023/0216448 A1 | 7/2023 | Liang | |

* cited by examiner

<u>FIG.1</u>

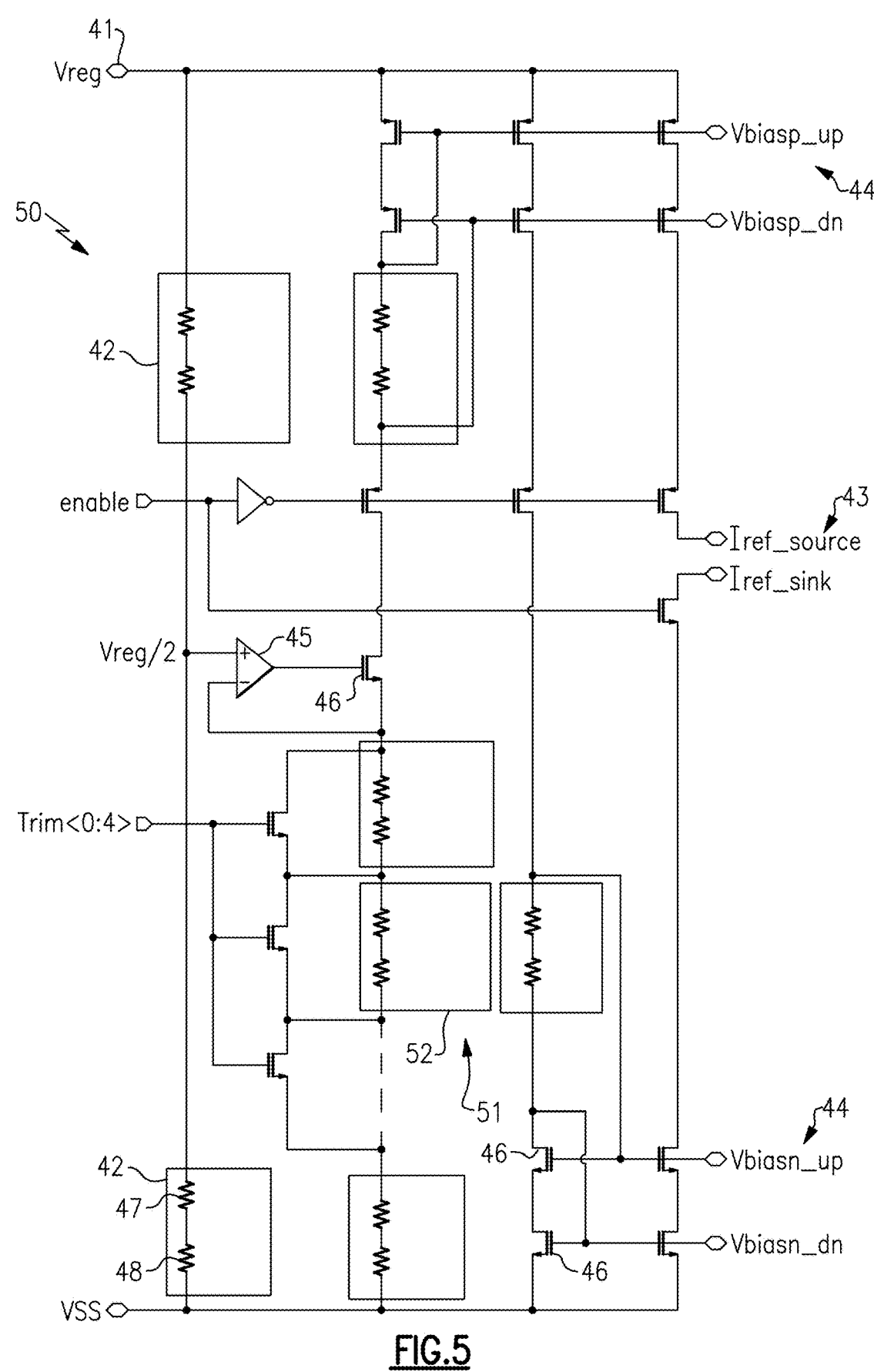
_FIG.5_

61 — RECEIVING AN INPUT VOLTAGE AT A VOLTAGE INPUT CONNECTED TO A RESISTOR PAIR WITH A ZERO TEMPERATURE COEFFICIENT FOR THE RESISTOR PAIR

62 — APPLYING THE INPUT VOLTAGE TO THE RESISTOR PAIR TO GENERATE A CURRENT WITH A ZERO TEMPERATURE COEFFICIENT

61 — RECEIVING AN INPUT VOLTAGE AT A VOLTAGE INPUT CONNECTED TO A RESISTOR PAIR WITH A ZERO TEMPERATURE COEFFICIENT FOR THE RESISTOR PAIR

62 — APPLYING THE INPUT VOLTAGE TO THE RESISTOR PAIR TO GENERATE A CURRENT WITH A ZERO TEMPERATURE COEFFICIENT

73 — TRIMMING TO COMPENSATE FOR THE PROCESS VARIATION OF THE RESISTOR PAIR

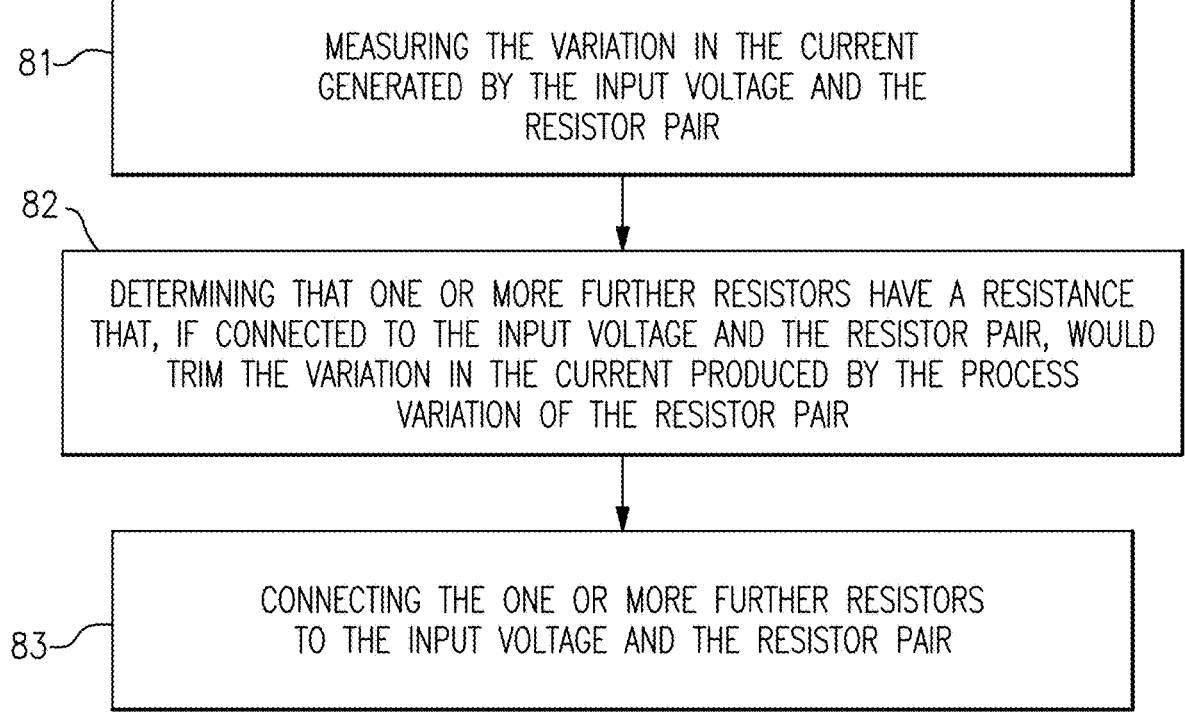

81 — MEASURING THE VARIATION IN THE CURRENT GENERATED BY THE INPUT VOLTAGE AND THE RESISTOR PAIR

82 — DETERMINING THAT ONE OR MORE FURTHER RESISTORS HAVE A RESISTANCE THAT, IF CONNECTED TO THE INPUT VOLTAGE AND THE RESISTOR PAIR, WOULD TRIM THE VARIATION IN THE CURRENT PRODUCED BY THE PROCESS VARIATION OF THE RESISTOR PAIR

83 — CONNECTING THE ONE OR MORE FURTHER RESISTORS TO THE INPUT VOLTAGE AND THE RESISTOR PAIR

FIG.8

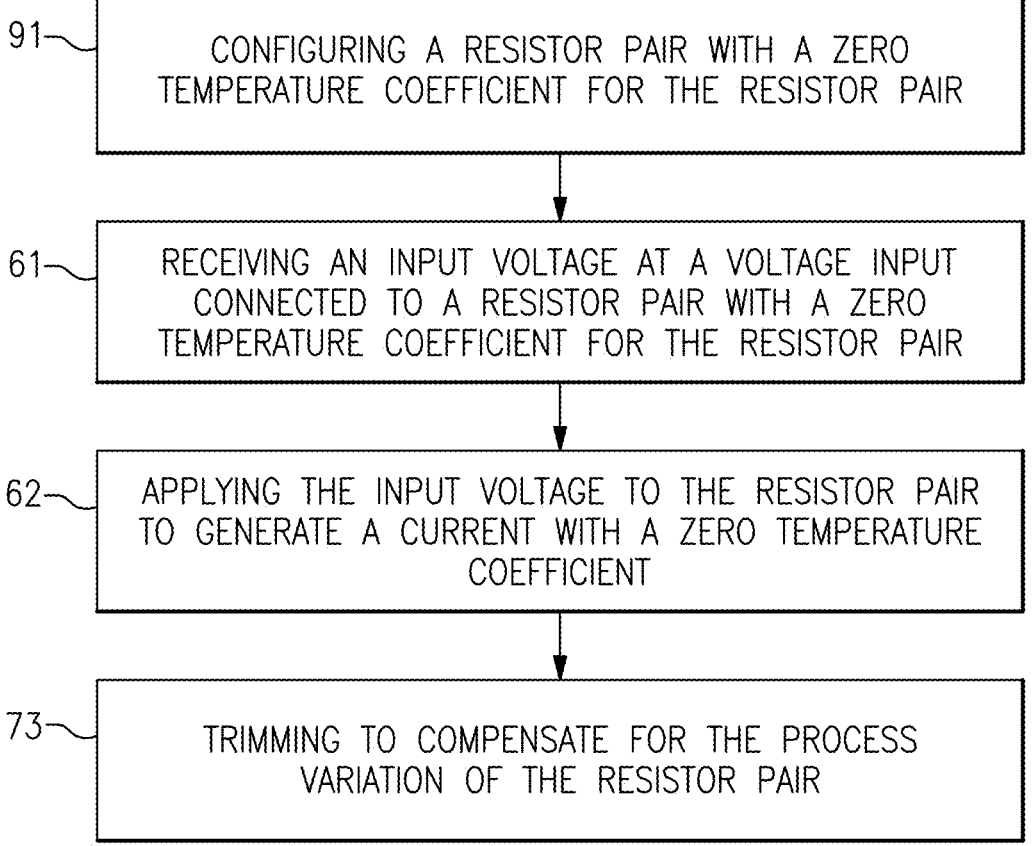

91 — CONFIGURING A RESISTOR PAIR WITH A ZERO TEMPERATURE COEFFICIENT FOR THE RESISTOR PAIR

61 — RECEIVING AN INPUT VOLTAGE AT A VOLTAGE INPUT CONNECTED TO A RESISTOR PAIR WITH A ZERO TEMPERATURE COEFFICIENT FOR THE RESISTOR PAIR

62 — APPLYING THE INPUT VOLTAGE TO THE RESISTOR PAIR TO GENERATE A CURRENT WITH A ZERO TEMPERATURE COEFFICIENT

73 — TRIMMING TO COMPENSATE FOR THE PROCESS VARIATION OF THE RESISTOR PAIR

CONSTANT  CURRENT
GENERATION  CIRCUIT

113

111

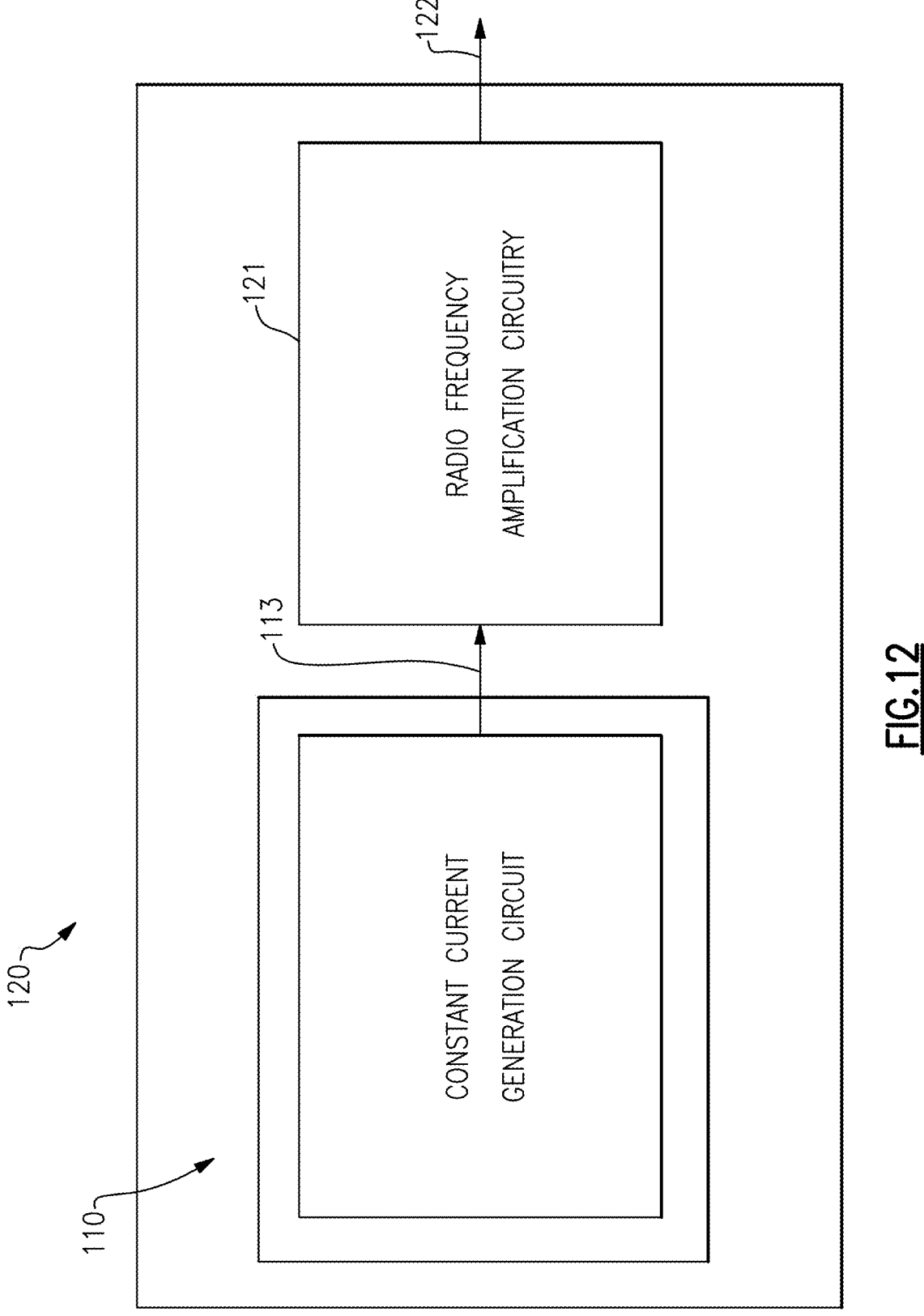
_FIG.12_

METHODS FOR GENERATING A CONSTANT CURRENT

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Field

Embodiments of the invention relate to the field of circuit technology for the generation of output current, and more particularly to systems and methods for the generation of constant current for use as reference currents, bias currents and the like.

Description of the Related Technology

A circuit with a resistor and a diode is commonly used with an input voltage to create a current for use as a bias or reference current, or to provide a bias or reference voltage, that can be used in numerous types of systems including amplifiers, sensors, etc. The circuit can be integrated into these systems or provided separately.

SUMMARY

In some aspects, the techniques described herein relate to a circuit assembly for generating a constant current, the circuit assembly including: a resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair; and a voltage input connected to the resistor pair and configured to receive an input voltage, the voltage input and the resistor pair configured to generate a current with a zero temperature coefficient.

In some aspects, the techniques described herein relate to a circuit assembly wherein the variability of resistance over temperature of the first resistor is based on a resistance of the first resistor and the positive temperature coefficient, and the variability of resistance over temperature of the second resistor is based on a resistance of the second resistor and the negative temperature coefficient.

In some aspects, the techniques described herein relate to a circuit assembly wherein the resistance and the positive temperature coefficient of the first resistor and the resistance and the negative temperature coefficient of the second resistor are such that the variability of resistance over temperature of the first resistor and the variability of resistance over temperature of the second resistor cancel.

In some aspects, the techniques described herein relate to a circuit assembly wherein the resistance of the first resistor and the resistance of the second resistor are chosen such that the positive temperature coefficient of the first resistor is equal in magnitude to the negative temperature coefficient of the second resistor, but opposite in polarity, such that the positive temperature coefficient of the first resistor and the negative temperature coefficient of the second resistor cancel to produce the zero temperature coefficient for the resistor pair.

In some aspects, the techniques described herein relate to a circuit assembly wherein the current is generated by the input voltage being applied across the resistor pair so as to be divided by the resistance of the resistor pair.

In some aspects, the techniques described herein relate to a circuit assembly further including a trimming component configured to compensate for a process variation of the resistor pair.

In some aspects, the techniques described herein relate to a circuit assembly wherein the trimming component includes one or more further resistors connected to the input voltage and the resistor pair, the resistance of the one or more resistors being so as to trim the variation in the current produced by the process variation of the resistor pair.

In some aspects, the techniques described herein relate to a circuit assembly wherein the resistance of the one or more resistors is set so that one or more bits of a bit value of output current that includes the variation are trimmed so as to trim the variation in the current produced by the process variation of the resistor pair.

In some aspects, the techniques described herein relate to a circuit assembly further including one or more current outputs for outputting the current with the zero temperature coefficient.

In some aspects, the techniques described herein relate to a circuit assembly further including a radio frequency amplification circuit connected to the one or more current outputs and configured to receive the current with the zero temperature coefficient as a bias or reference current.

In some aspects, the techniques described herein relate to a circuit assembly wherein the radio frequency amplification circuit includes a radio frequency protection circuit connected to the one or more current outputs and configured to receive the current with the zero temperature coefficient as a bias or reference current.

In some aspects, the techniques described herein relate to a circuit assembly further including one or more voltage outputs for applying an output voltage set by the current with the zero temperature coefficient.

In some aspects, the techniques described herein relate to a circuit assembly further including a radio frequency amplification circuit connected to the one or more voltage outputs and configured to receive the output voltage as a bias or reference voltage.

In some aspects, the techniques described herein relate to a circuit assembly wherein the radio frequency amplification circuit includes a radio frequency protection circuit connected to the one or more voltage outputs and configured to receive the output voltage as a bias or reference current.

In some aspects, the techniques described herein relate to a radio frequency amplifier system including: a radio frequency amplifier; a circuit assembly configured to generate a constant current, the circuit assembly including a resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair, and the circuit assembly further including a voltage input connected to the resistor pair and configured to receive an input voltage, the voltage input and the resistor pair configured to generate a current with a zero temperature coefficient.

In some aspects, the techniques described herein relate to a radio frequency amplifier wherein the circuit assembly is configured to provide the generated current as a bias current for the radio frequency amplifier.

In some aspects, the techniques described herein relate to a mobile device including: an antenna; a radio frequency amplifier provided on a die; a circuit assembly provided on the die and configured to generate a constant current, the circuit assembly including a resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair, and the circuit assembly further including a voltage input connected to the resistor pair and configured to receive an input voltage, the voltage input and the resistor pair configured to generate a current with a zero temperature coefficient.

In some aspects, the techniques described herein relate to a method wherein the variability of resistance over temperature of the first resistor is based on a resistance of the first resistor and the positive temperature coefficient, and the variability of resistance over temperature of the second resistor is based on a resistance of the second resistor and the negative temperature coefficient.

In some aspects, the techniques described herein relate to a method wherein the resistance and the positive temperature coefficient of the first resistor and the resistance and the negative temperature coefficient of the second resistor are such that the variability in resistance over temperature of the first resistor and the variability in resistance over temperature of the second resistor cancel.

In some aspects, the techniques described herein relate to a method wherein the resistance of the first resistor and the resistance of the second resistor are chosen such that the positive temperature coefficient of the first resistor is equal in magnitude to the negative temperature coefficient of the second resistor, but opposite in polarity, such that the positive temperature coefficient of the first resistor and the negative temperature coefficient of the second resistor cancel to produce the zero temperature coefficient for the resistor pair.

In some aspects, the techniques described herein relate to a method further including configuring the resistor pair such that the resistor pair has a zero temperature coefficient, the configuring including: varying the resistance of the first resistor and the resistance of the second resistor until the variability of resistance over temperature of the first resistor and the variability of resistance over temperature of the second resistor cancel; selecting as the first resistance for the first resistor and the second resistance for the second resistor the resistance of the first resistor and the resistance of the second resistor that results in the cancellation of the variability of resistance over temperature of the first resistor and the variability of resistance over temperature of the second resistor.

In some aspects, the techniques described herein relate to a method wherein the current is generated by the input voltage being divided by the resistance of the resistor pair.

In some aspects, the techniques described herein relate to a method wherein the first resistor and the second resistor are arranged in series.

In some aspects, the techniques described herein relate to a method wherein the first resistor and the second resistor are arranged in parallel.

In some aspects, the techniques described herein relate to a method wherein the voltage input is a bandgap voltage input and the input voltage is a bandgap voltage.

In some aspects, the techniques described herein relate to a method further including trimming to compensate for a process variation of the resistor pair.

In some aspects, the techniques described herein relate to a method wherein the trimming includes providing one or more further resistors connected to the input voltage and the resistor pair, the resistance of the one or more resistors being so as to trim the variation in the current produced by the process variation of the resistor pair.

In some aspects, the techniques described herein relate to a method wherein the providing the one or more further resistors includes: measuring the variation in the current generated by the input voltage and the resistor pair; determining that the one or more further resistors have a resistance that, if connected to the input voltage and the resistor pair, would trim the variation in the current produced by the process variation of the resistor pair; and connecting the one or more further resistors to the input voltage and the resistor pair.

In some aspects, the techniques described herein relate to a method wherein the resistance of the one or more resistors is set so that one or more bits of a bit value of output current that includes the variation are trimmed so as to trim the variation in the current produced by the process variation of the resistor pair.

In some aspects, the techniques described herein relate to a method wherein the one or more further resistors are connected to the input voltage and the resistor pair by a switch.

In some aspects, the techniques described herein relate to a method further including providing the voltage input and the resistor pair on a die.

In some aspects, the techniques described herein relate to a method for operating a radio frequency amplifier, the method including: receiving an input voltage at a voltage input connected to a resistor pair, the resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair; and applying the input voltage to the resistor pair to generate a current with a zero temperature coefficient; and using the generated current to operate a radio frequency amplifier.

In some aspects, the techniques described herein relate to a method further wherein using the generated current to operate a radio frequency amplifier includes using the generated current as a bias current for a radio frequency amplifier.

In some aspects, the techniques described herein relate to a method wherein using the generated current to operate a radio frequency amplifier includes using the generated current as a bias current for protection circuitry for a radio frequency amplifier.

In some aspects, the techniques described herein relate to a method wherein using the generated current to operate a radio frequency amplifier includes using the generated current to set a reference voltage for a radio frequency amplifier.

In some aspects, the techniques described herein relate to a method wherein using the generated current to operate a radio frequency amplifier includes using the generated current to set a reference voltage for protection circuitry for a radio frequency amplifier.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5 is an illustration of a circuit diagram of a second circuit assembly for generating constant current according to aspects of the present invention;

FIG. 8 is a flow diagram of a method for trimming variation in the current according to aspects of the present invention;

FIG. 9 is a flow diagram of a method for generating constant current according to aspects of the present invention which includes an initial configuration step and the trimming step;

FIG. 12 is an illustration of an exemplary radio frequency amplifier system according to aspects of the present invention;

DETAILED DESCRIPTION

Aspects and embodiments described herein are directed to a circuit assembly for generating a constant current having improved constancy. In more detail circuit is provided having a compact arrangement of hardware components that themselves provide reduced output current variability over temperature, but also allows for reduction is variability over process.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
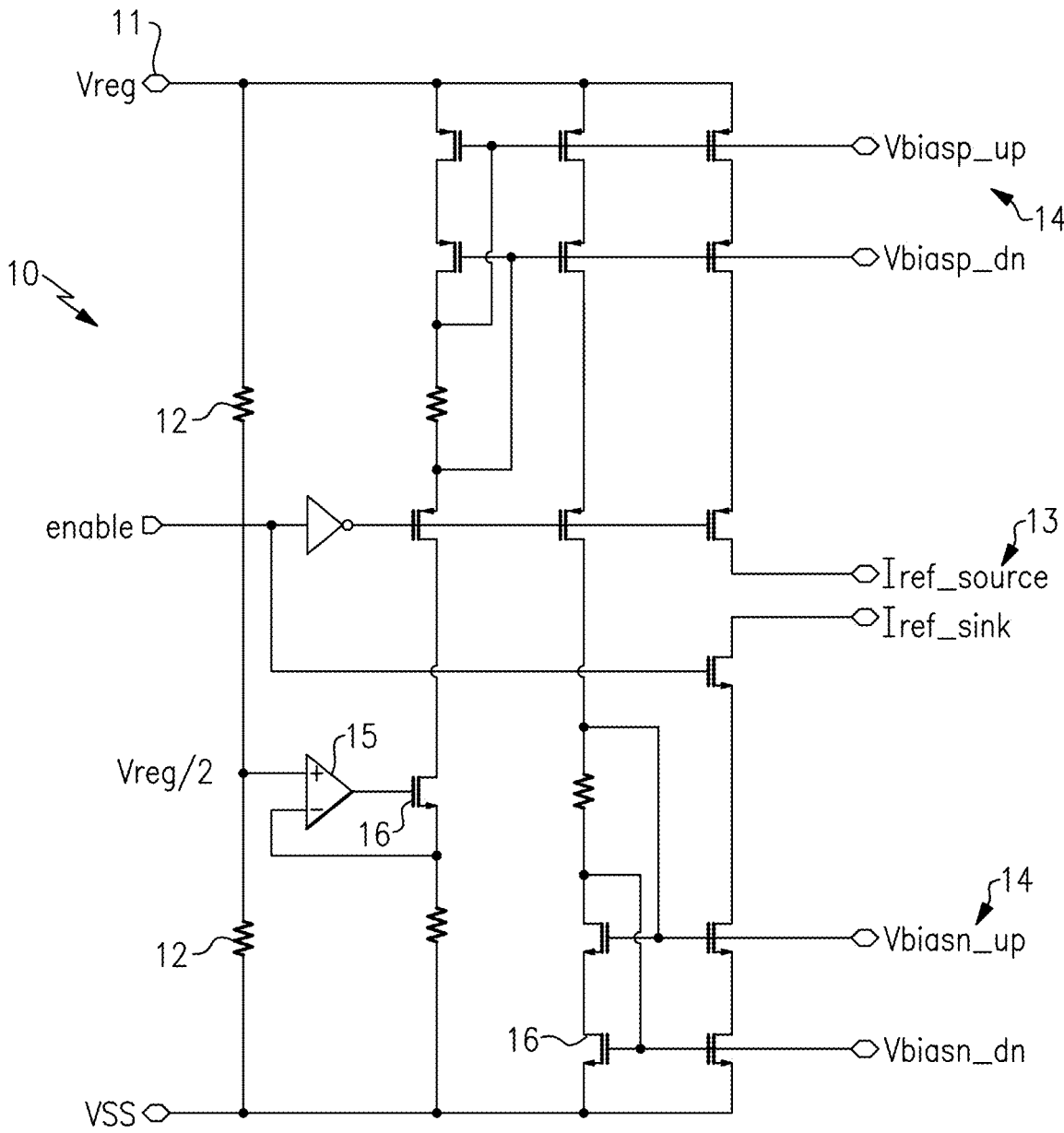
FIG. 1 is an illustration of a circuit diagram of a known circuit for generating a bias or reference current.

FIG. 1 shows an example of a circuit 10 for generating constant output current. The circuit may be provided on a die. The circuit comprises one or more voltage inputs 11—labelled as Vreg in FIG. 1—which applies an input voltage across one or more resistors 12, one or more current outputs 13, and one or more voltage outputs 14. The VSS voltage pin may act as the ground pin, or may be part of the one or more voltage inputs 11 (for example, supplying a separate input voltage to that of Vreg), as would be clear to one skilled in the art. The output current is generated by applying the input voltage (received by e.g. Vreg) across the resistors 12 (i.e. taking the ratio of the voltage and the resistance, as would be apparent to those skilled in the art). In the example shown in FIG. 1, there are two sets of one or more voltage outputs 14. The first set of one or more outputs—Vbiasp_up and Vbiasp_down—allows an output biasing voltage to be applied to a P-channel metal-oxide-semiconductor (PMOS) current source. The second set of one or more outputs—Vbiasn_up and Vbiasn_down—allows an output biasing voltage to be applied to an N-channel metal-oxide-semiconductor (NMOS) current sink. The output voltage applied by the voltage outputs 14 may be set by the output current. Similarly there are two current outputs 13, one, ref_source, for providing the output current as a reference output current to a PMOS current source, and one, ref_sink, for providing the output current as a reference output current to an NMOS current sink. The circuit also comprises switching components, shown in the circuit diagram as diodes 15 and field effect transistors (FETs) 16. These switching components allow the current, generated by the input voltage operating across resistors 12, to be directed to the appropriate current output 13, and allows control over the voltage outputs 14—e.g. whether a voltage is applied to a PMOS current source and/or to an NMOS current sink. The operation of the diodes 15 and the FETs 16 in order to apply bias voltages or reference currents is well known in the art and will not be described in detail here.

In the arrangement of FIG. 1 the resistance of each resistor 12 varies over temperature T and over process P (i.e. variation of fabrication/operating parameters). The inherent properties of any resistor used in this circuit are such that the resistance will vary over temperature T and process P during operation. This will introduce inevitable variation in the output current over both T and P. The current fluctuations have an adverse effect on the circuit into which the current is being fed as a bias or reference current. This means that the current generated by applying the input voltage from voltage input 11 across the resistors 12 also varies. This results in the generation of a non-stable output bias/reference current and/or voltage. This can affect the performance of those components into which the output current/voltage is applied.

Figure 2:
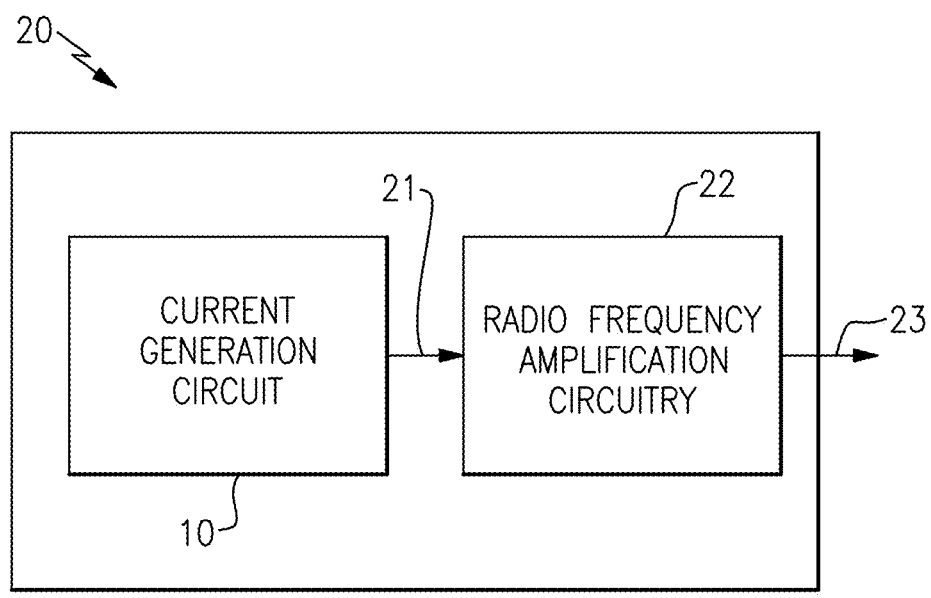
FIG. 2 is an illustration of an exemplary radio frequency amplifier system comprising a current generation circuit such as that of FIG. 1.

For example, FIG. 2 shows a radio frequency (RF) amplifier 20 in which a current generation circuit 10 is feeding an output reference current 21 into RF amplification circuitry 22. An unstable reference current 21 may negatively impact the performance of the RF amplification, for example by affecting the linearity of amplification of the output RF signal 23.

Figure 3:
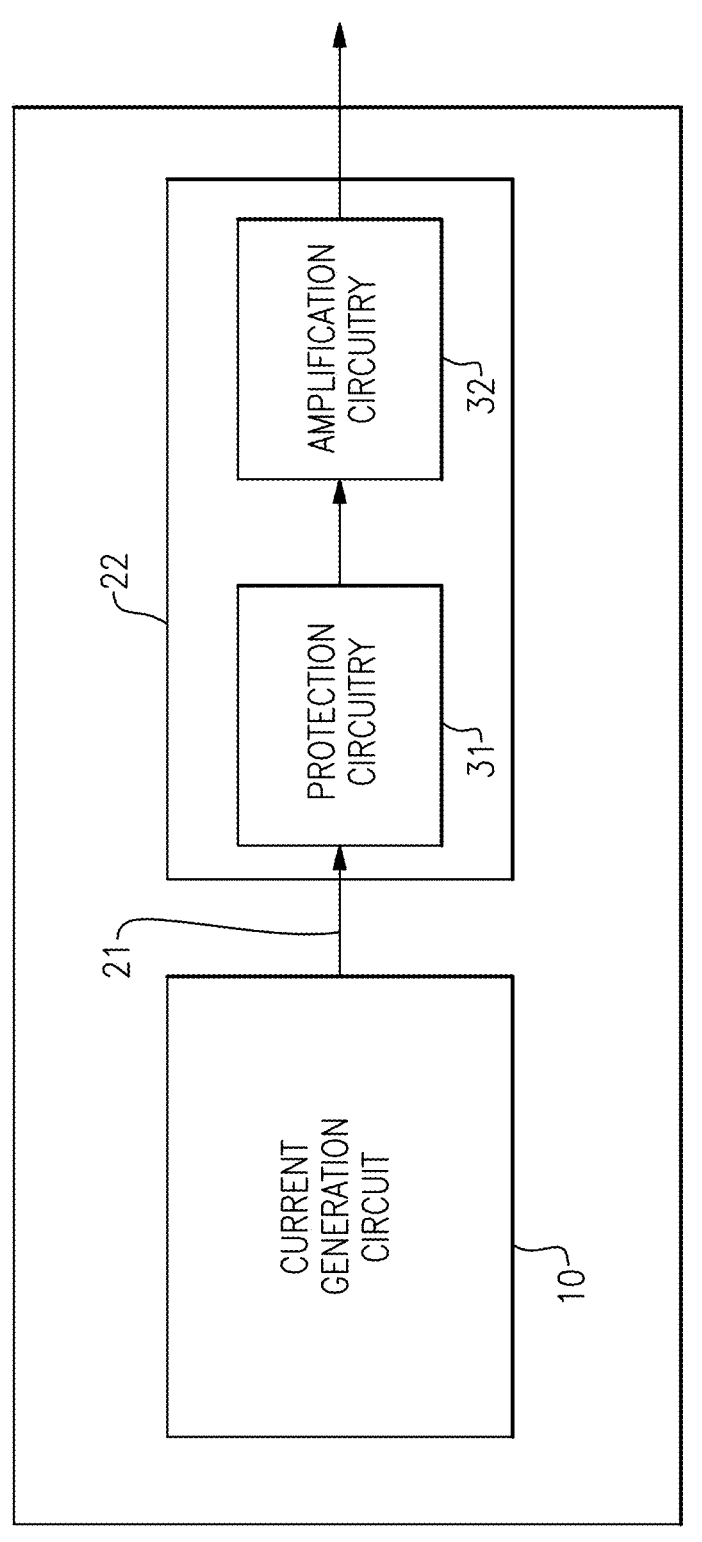
FIG. 3 is an illustration of an exemplary radio frequency amplifier system comprising a current generation circuit such as that of FIG. 1.

FIG. 3 shows an implementation of the arrangement of FIG. 2 in which the RF amplification circuitry 22 comprises protection circuitry 31 (e.g. an RF isolation circuit) and amplification circuitry 32. Here, the reference current 21 is fed into the RF amplification circuitry 22 through the protection circuitry 31. Again, an unstable reference current may negatively affect circuit performance, for example by reducing the effectiveness of the protection circuitry 31. For example, an unstable reference current may affect the accuracy of a temperature sensor of the protection circuitry 31, which may lead to overheating of the core circuitry of the RF amplification system.

It is noted that the components and operation of the RF amplifier as shown in FIG. 2 or FIG. 3 (e.g. protection circuitry and amplification circuitry) are well known in the art and will not be described in detail here.

Attempts have been made to address this fluctuation, for example by providing a separate off-die resistor having a resistance that is set to counter the fluctuations and thus produce a more stable current output. However, this additional off-die component increases the overall size of the circuit assembly, which may not be appropriate in many applications. Further, the off-die resistor will have its own inherent variability over P and T (process and temperature), meaning that variability is being generated by components both on die and off die, which leads to increased complexity in current variability.

According to some aspects of the present disclosure, a circuit for generating current with improved stability—i.e. reduced output variability—is provided. A constant current output can be used to improve performance of a number of different circuit systems and processes, such as complementary metal-oxide-semiconductor, CMOS, based circuits and processes.

Figure 4:
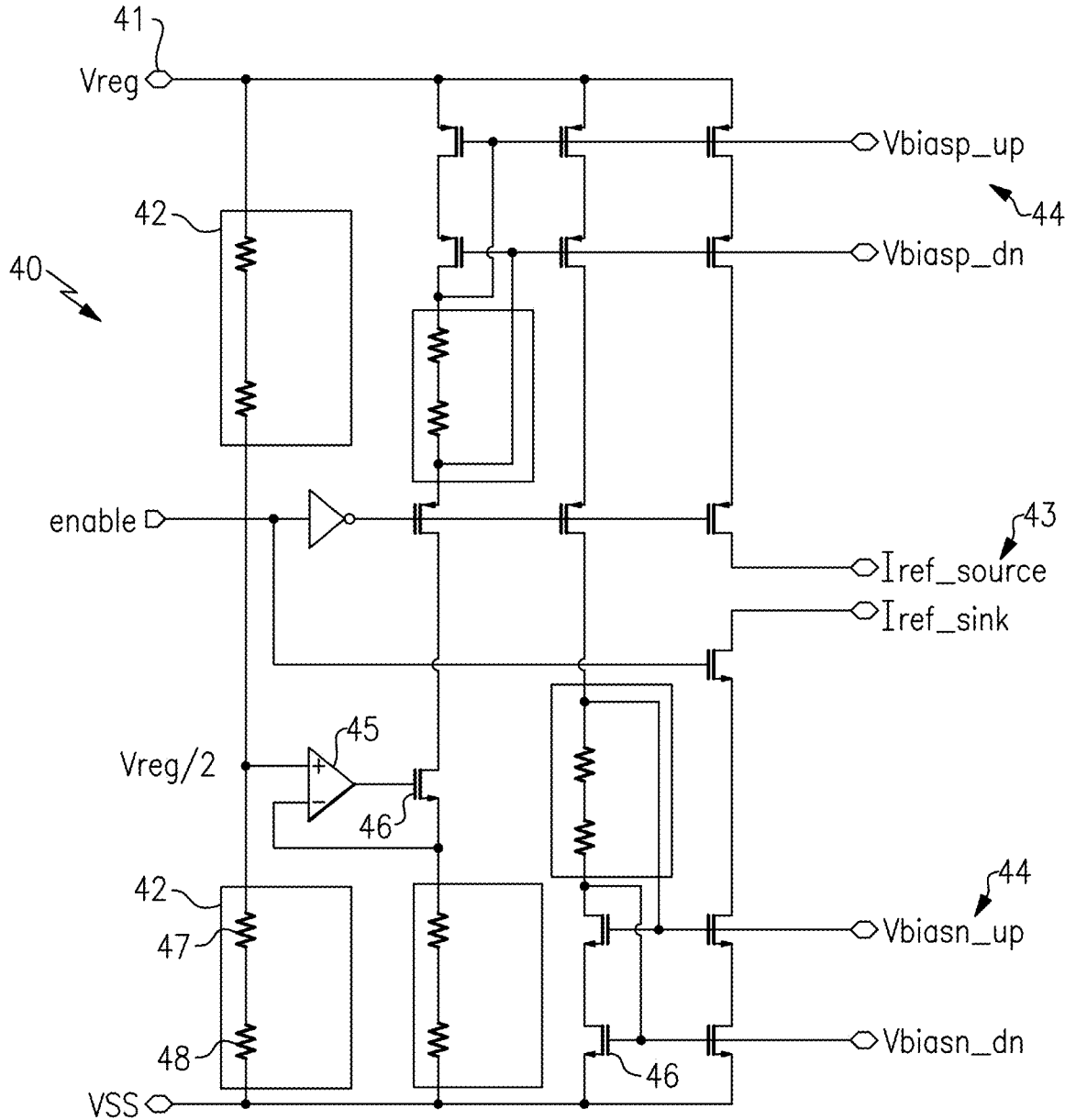
FIG. 4 is an illustration of a circuit diagram of a first circuit assembly for generating constant current according to aspects of the present invention.

FIG. 4 shows a circuit for generating a constant current 40 according to aspects of the present disclosure. The circuit 40 is provided on a die. The arrangement of FIG. 4 has a similar arrangement to the arrangement of FIG. 1. The circuit comprises one or more voltage inputs 41—here, Vreg—which provides a bandgap-based low-dropout (LDO) supply, one or more current outputs 43, and one or more voltage outputs 44. The VSS voltage pin may act as the ground pin, or may be part of the one or more voltage inputs 41 (for example, supplying a separate input voltage to that of Vreg), as would be clear to one skilled in the art. There are two sets of one or more voltage outputs. The first set of one or more outputs, here Vbiasp_up and Vbiasp_down, allow an output biasing voltage to be applied to a P-channel metal-oxide-semiconductor (PMOS) current source. For example, Vbiasp_up may supply a bias voltage to a main PMOS current mirror of the current source, and Vbiasp_down may supply a bias voltage to a cascode PMOS current mirror of the current source. The second set—Vbiasn_up and Vbiasn_down—allows an output biasing voltage to be applied to an N-channel metal-oxide-semiconductor (NMOS) current sink. For example, Vbiasn_up may supply a bias voltage to a main NMOS current mirror of the current sink, and Vbiasn_down may supply a bias voltage to a cascode NMOS current mirror of the current sink. Similarly there are two current outputs 43, one, ref_source, for providing a reference output current to a PMOS current source, and one, ref_sink, for providing a reference output current to an NMOS current sink. The output bias voltages, and the output reference current, may provide stable operating conditions for many different electronic devices, such as amplifiers. The circuit also comprises switching components, shown in the circuit diagram such as diodes 45 and field effect transistors (FETs) 46. These switching components, like in the arrangement of FIG. 1, allow the current generated to be directed to the appropriate current output 43, and allows control over the voltage outputs 44—e.g. whether a voltage is applied to a PMOS current source and/or to an NMOS current sink. The voltage outputs 44 may be set by the generated output current. The operation of the diodes 45 and the FETs 46 in order to apply bias voltages or reference currents is well known in the art and will not be described in detail here.

Importantly, however, FIG. 4 comprises one or more resistor pairs 42 including a first resistor 47 and a second resistor 48. The first resistor 47 has a positive temperature coefficient (PTC) and the second resistor 48 has a negative temperature coefficient (NTC). A PTC resistor is a resistor that has a resistance that increases with a rise in temperature, and an NTC resistor is a resistor that has a resistance that increases with a drop in temperature. The first 47 and second 48 resistors are configured such that the variation in resistance over temperature (over temperature here meaning as temperature changes) of the first resistor and the variation in resistance over temperature of the second resistor cancel to produce a zero temperature coefficient (ZTC) for the resistor pair 42. The resistor pair having a ZTC means that the net resistance of the pair is stable across temperature. For example, if the temperature rises, the increase in resistance of the PTC resistor 47 is offset by the corresponding decrease in resistance of the NTC resistor 48. The result is a resistor pair 42 with a resistance that is stable across T. In the arrangement shown in FIG. 4 two resistor pairs 42 are connected in series, with voltage input 41 connects directly across both resistor pairs 42. A further two resistor pairs are connected together in series, but arranged in parallel to the original two resistor pairs 42. A last resistor pair is then connected in parallel both two the original resistor pairs 42 and the further two resistor pairs. The further two resistor pairs and the last resistor pairs are switchably connected to the original two resistor pairs 42, and the inputs and the outputs of the circuit—i.e. they are connected in to the circuit via FETs so that they can be connected or disconnected to the rest of the circuit as the use case demands. Of course, it would be apparent to those skilled in the art that other arrangements are possible. For example, the circuit may only have a single resistor pair 42 or three or more resistor pairs connected in series.

The voltage input 41 is connected to the resistor pair 42 and configured to receive an input voltage. The voltage input 41 and the resistor pair 42 are configured to generate a current with a ZTC. In particular, the voltage input 41 applies the input voltage across the resistor pair 42 to generate the ZTC current, the current being calculated by dividing the applied voltage by the resistance of the resistor pair 42. The resistors of the resistor pair 42 are arranged in series in this aspect, but they may be arranged in parallel.

The resistance and the PCT of the first resistor 47 and the resistance and the NTC of the second resistor 48 are such that the resistor pair 42 has a ZTC. In particular, the resistance value of the first resistor 47 and its PTC determine how much the resistance will vary for a given temperature change of the first resistor during its operation. Similarly, the resistance of the second resistor 48 and its NTC determine how much the resistance for the second resistor 48 will vary for a given temperature change of the second resistor. Thus, for a known PTC of the first resistor and a known NTC of the second resistor, the resistances of the two resistors can be set so that their variations over T are equal and opposite. This results in a ZTC resistor pair. This may be done by scaling/ratio-ing the resistances of the two resistors until a ZTC is observed for the resistor pair, for example. In the present example, the ratio of NTC over PTC is –2.52, which is a measure of each resistors variation over T. Given this, the resistance of each resistor can be chosen so that the variation cancels. In another example, the resistances are chosen (e.g. by scaling the resistors) so that the magnitude of the PTC of the first resistor is equal to the magnitude of the NTC of the second resistor, but with an opposite polarity (one being positive and the other negative), such that the result is a ZTC.

Thus, providing a resistor pair with a ZTC results in the generation of an output current that is substantially constant across T (temperature). This is achieved through the use of components that may be placed on a single die. In particular, the component responsible for generation of the reference current—i.e. a resistor—is replaced by a component that generates the reference current whilst compensating for its own variation over T—the resistor pair configured such as to have a zero temperature coefficient. Thus a compact arrangement is provided that avoids the need for additional off-die components dedicated to compensating variation over T whilst maintaining good current stability.

Of course, perfect constancy cannot be achieved in practice. However, here, when using the term "constant" we mean constant compared to the variation that would occur from the use of a single PTC or NTC resistor; the constancy is referring to the fact that the variation inherent in the operation of each single resistor is being cancelled by the variation of the other resistor. Thus, the current produced by the resistor pair is more stable—there is less variation in resistance over temperature—compared to the current that would be produced if each resistor was used by itself. In other words, the variation of resistance over temperature of the resistor pair is substantially lower than that of each resistor individually. This is what is meant by constant current in the context of the present invention.

This constant current can then be passed to current output 43 for use as a reference or bias current in a number of different applications (RF amplification or sensing, for example). The current can also be used to set the voltage outputs such that bias or reference voltages can be provided to other circuits (again, RF amplification or sensing are examples).

FIG. 5 shows a circuit for generating a constant current 50 according to aspects of the present disclosure. This circuit 50 is the same as circuit 40 (with like components referenced with like numerals) except that circuit 50 further comprising a trimming component 51 configured to compensate for the process (P) variation of the one or more resistor pairs 42. The trimming component 51 comprises one or more further resistors 52 connected to the input voltage 41 and the resistor pair 42, the resistance of the one or more resistors 52 being so as to trim the variation in the current produced by the P variation of the one or more resistor pairs 42. The one or more further resistors 52 are connected to the input voltage and the resistor pair 42 by additional switching components—e.g. the FETs 46. Here, the one or more resistors 52 comprise two additional resistor pairs.

The presence of these additional resistors 52 allow variation over process P to be compensated for. In particular, the process over P of the resistor pairs 42 can be analyzed and one or more of the additional resistors 52 can be wired in using the appropriate FETs 46 to compensate for the variation over process (and also over the bandgap reference voltage—i.e. variation over V can also be compensated for using this trimming technique). For example, the variation is seen in the digital current value produced by the resistor pairs 42 and the input voltage; variation is seen in the bit value of the current. By wiring in additional resistors 52 the bits that are varying (e.g. least significant bits) are trimmed (e.g. removed from the bit value) such that the resulting trimmed current value appears stable. This can be done in a pre-processing step, during the set-up and initial calibration of the circuit for example. The use of resistor pairs for the additional resistors 52 prevents additional variation over T being introduced into the circuit.

All the components of FIG. 5 may be provided on a single die. Including on a single die the components responsible for variation compensation over T—i.e. resistor pair 42—allows for the above described trimming method to also be implemented on die. As all variation over P is confined to the die (there is no additional off-die components compensating for variation over T), this variation can be effectively and efficiently trimmed in the manner described. In contrast, for arrangements in which the compensation for variation in resistance over T is performed by an off-die component, the variation over P is caused by both on die and off die components which makes the variation much more difficult to resolve.

Thus, the circuit 50 allows for effective compensation over T, in the same manner as described in relation to FIG. 4, as well as compensation over P (and indeed some compensation over V), all without the need for additional off-die components. This provides a compact circuit that produces output current that is stable over P and T (and often V as well).

FIGS. 6-10 show flow diagrams according to various aspects of the present disclosure. These provide exemplary illustrations of the operation of the above discussed circuits that are according to aspects of the present disclosure (e.g. the circuits of FIG. 4 or FIG. 5).

Figure 6:
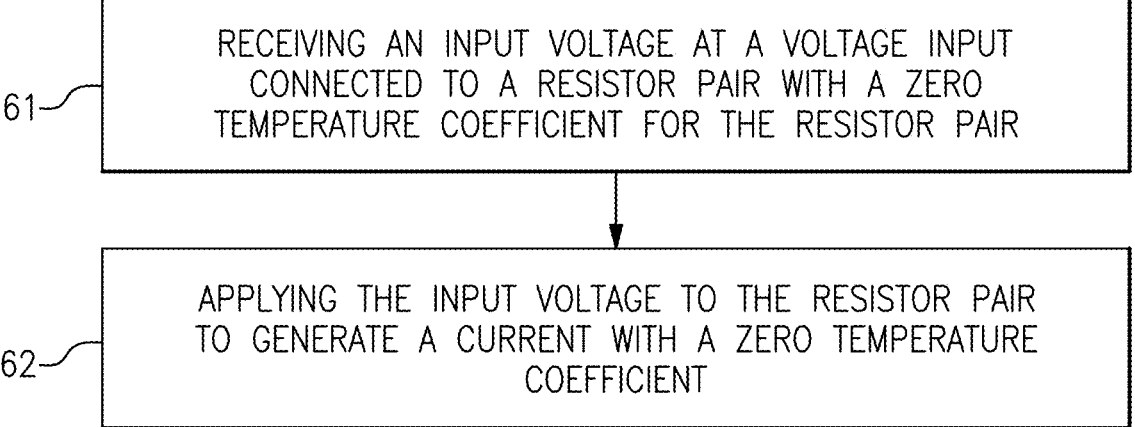
FIG. 6 is a flow diagram of a method for generating constant current according to aspects of the present invention.

FIG. 6 shows a general method of generating a constant current according to aspects of the present disclosure. At step 61, an input voltage, for example a Bandgap-based LDO supply, is received at a voltage input such as voltage input 41. The voltage input is connected to a resistor pair, such as resistor pair 42. The resistor pair includes a first resistor, e.g. resistor 47, and a second resistor, e.g. resistor 48. The first resistor has a PTC and the second resistor has a NTC as discussed above. The first and second resistors are configured such that the positive temperature coefficient and the negative temperature coefficient cancel to produce a zero temperature coefficient for the resistor pair. At step 62, the input voltage is applied to the resistor pair to generate a current with a zero temperature coefficient.

Figure 7:
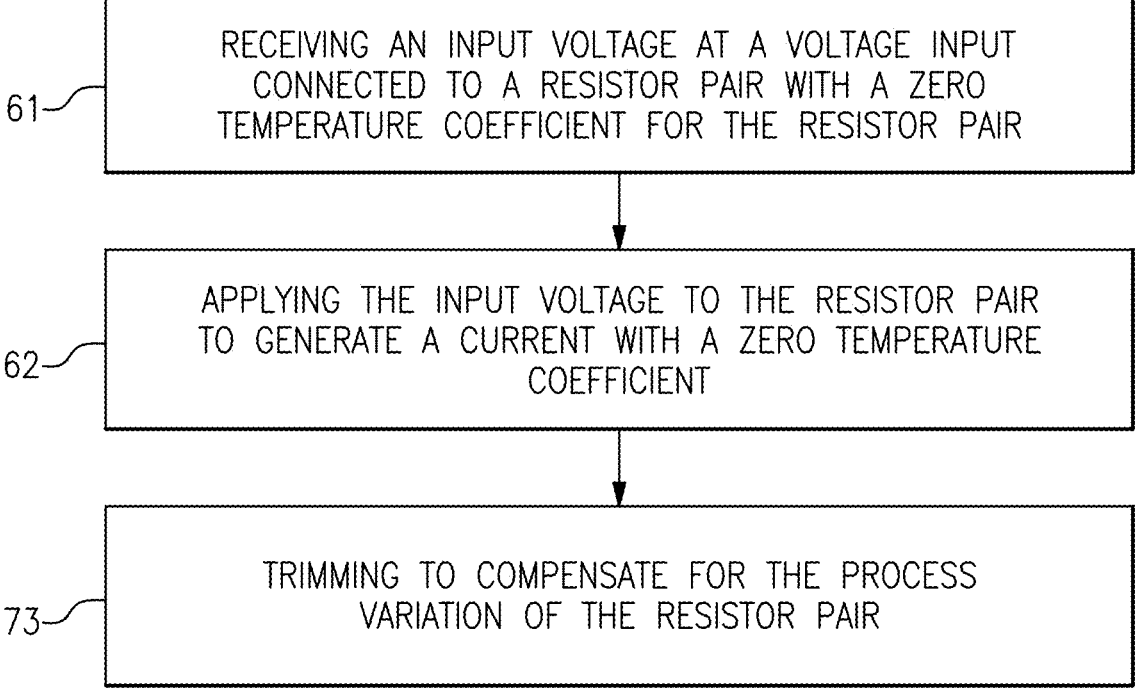
FIG. 7 is a flow diagram of a method for generating constant current according to aspects of the present invention which includes a trimming step.

FIG. 7 shows the same method as FIG. 6 except that there is an additional trimming step 71 to compensate for the process variation of the resistor pair. As discussed above, the trimming can be configured during the initial set up of the circuit so that the trimming occurs automatically during the operation of the circuit. The details of how this initial configuration for the trimming may be performed are shown in FIG. 8. Firstly, at step 81 the variation in the current generated by the input voltage and the resistor pair is measured. At step 82, one or more further resistors, such as resistors 52, are determined that have a resistance that, if connected to the input voltage and the resistor pair, would trim the variation in the current produced by the process variation of the resistor pair. Finally, at step 83, the one or more further resistors are connected to the input voltage and the resistor pair, for example by an appropriate switch, such as FET 46. As discussed above, the trim is to the bit value of the generated current—the resistance is chosen so that when connected to the input voltage and the resistor pair, the bits containing the variation over process are trimmed, resulting in a stable current value.

Figure 10:
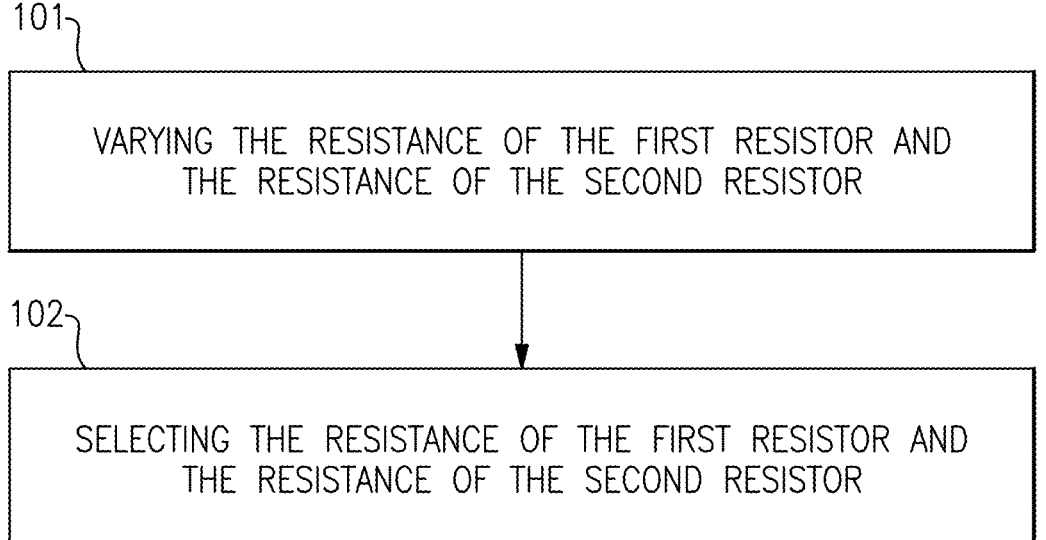
FIG. 10 is a flow diagram of a method for configuring resistor pairs according to aspects of the present invention.

FIG. 9 shows the same method as FIG. 7 except that an initial configuration step for the resistor pair is included in the method. In particular, additional step 91 is included in which the resistor pair is actively configured with a zero temperature coefficient. The details of how this initial configuration may be performed are shown in FIG. 10. At step 101 the resistance of the first resistor and the resistance of the second resistor are varied until the of the first resistor and the variation in resistance over T of the second resistor cancel. At step 102, the resistance of the first resistor and the resistance of the second resistor that results in the cancellation of variation in resistance over T of the first resistor and the variation in resistance over T of the second resistor are selected as the first resistance for the first resistor and the second resistance for the second resistor.

The current generated by any one of the above methods may be used as a bias or reference current for a radio frequency amplifier or for protection circuitry for a radio frequency amplifier. Similarly, the current generated by any one of the above methods may be used to set a bias or reference voltage for a radio frequency amplifier or for protection circuitry for a radio frequency amplifier.

Although aspects of the present disclosure have been described in relation to the particular examples shown in FIG. 4 and FIG. 5, these circuits should not be considered limiting. The core components for the circuit for generating a constant current according to aspects of the present disclosure are:

a resistor pair including a first resistor and a second resistor, the first resistor having a positive temperature coefficient and the second resistor having a negative temperature coefficient, the first and second resistors being configured such that the variation in resistance over T of the first resistor and the variation in resistance over T of the second resistor cancel to produce a zero temperature coefficient for the resistor pair; and a voltage input connected to the resistor pair and configured to receive an input voltage, the voltage input and the resistor pair configured to generate a current with a zero temperature coefficient.

Thus, aspects of the present disclosure include any appropriate circuit implementing the above components. For example, the number of resistor pairs 42 of the circuits of FIG. 4 or 5 may be varied as necessary (e.g. 1, 2, 3, 4, 5, 6, or more resistor pairs). Alternatively, or in addition, the number of voltage outputs 44 and/or current outputs 43 may be varied (e.g. 1, 2, 3, 4 or more). The same applies to the voltage inputs and/or switching components e.g. diodes 45 and the FETs 46. Similarly, the number of additional resistors 52 of the trimming component 51 may be varied as necessary (e.g. 1, 2, 3, 4 or more). It is also noted that the circuits of FIG. 4 and FIG. 5 have been described in relation to certain components such as diodes, FETs etc., but any appropriate hardware component capable of performing e.g. the switching function of the diodes ad FETs may be used.

Figure 11:
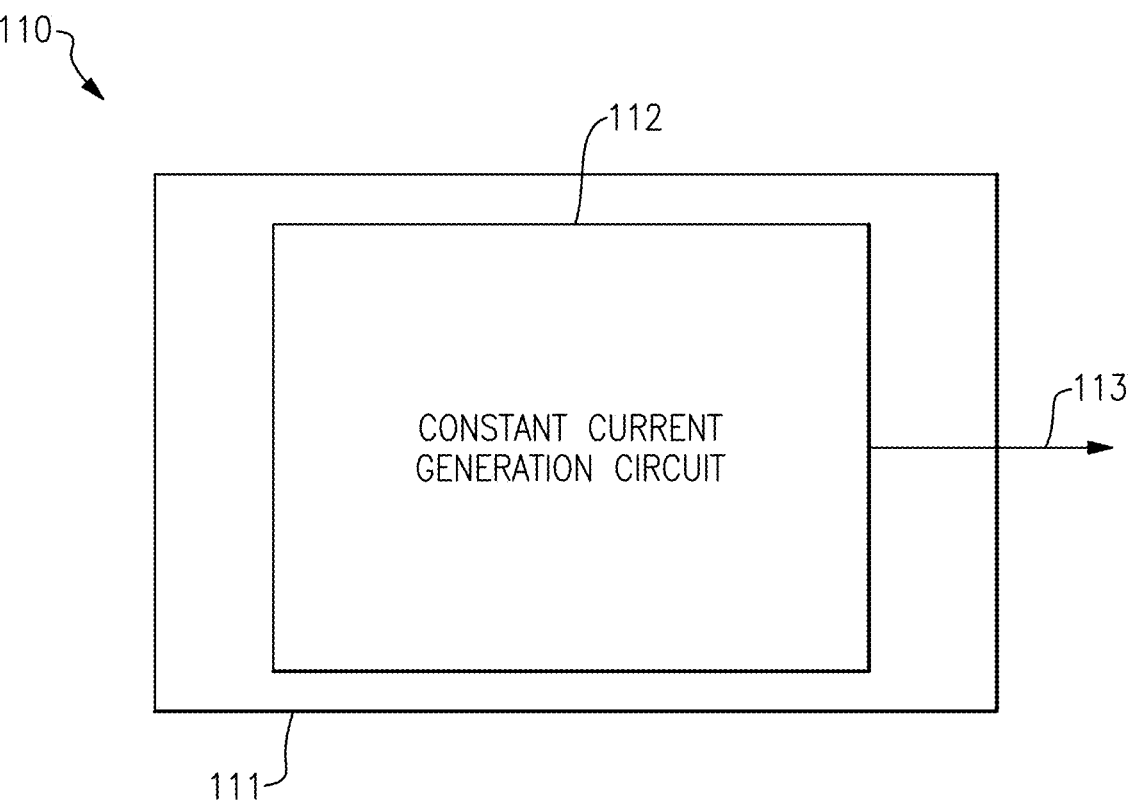
FIG. 11 is an illustration of an exemplary circuit assembly having a constant current generation circuit disposed on a die.

Such circuits (including the circuits of FIGS. 4 and 5) may be implemented on a single die, as shown in FIG. 11. The circuit assembly 110 comprises die 111 on which a circuit 112 for generating a constant current 113 according to aspects of the present disclosure is implemented.

Figure 13:
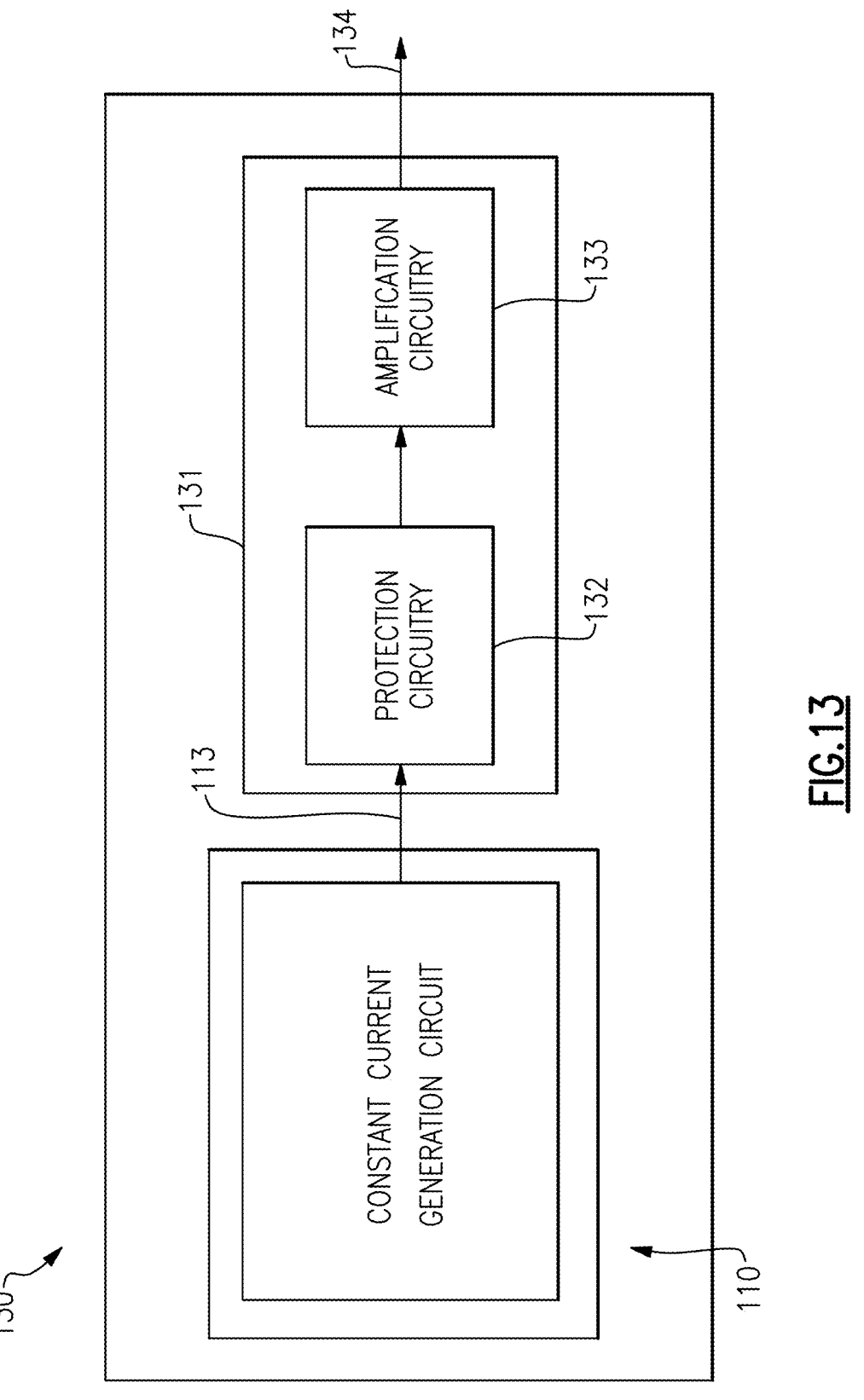
FIG. 13 is an illustration of an exemplary radio frequency amplifier system according to aspects of the present invention.

These on-die circuit assemblies 110 may be used as the constant current generation circuit of an RF amplification system 120 shown in FIG. 12 or the RF amplification system 130 shown in FIG. 13. In FIG. 12 the RF amplification system 120 comprises the integrated on-die circuit assembly 110 (i.e. system 120 comprises die 111 which itself comprise the circuit assembly 112 for generating a constant current 113. The constant current 113 generated by on-die circuit assembly 110 is fed into Radio frequency amplification circuitry 121 as a reference or bias current to improve generation of RF output 122. In FIG. 13 the constant current 113 generated by on-die circuit assembly 110 is fed into protection circuitry 132 of Radio frequency amplification circuitry 131 as a reference or bias current to improve generation of RF output from amplification circuitry 134. In other words, the circuit according to aspects of the present disclosure could be included in a RF amplification circuit to feed into the amplification circuitry reference or bias current or reference or bias voltage.

Figure 14:
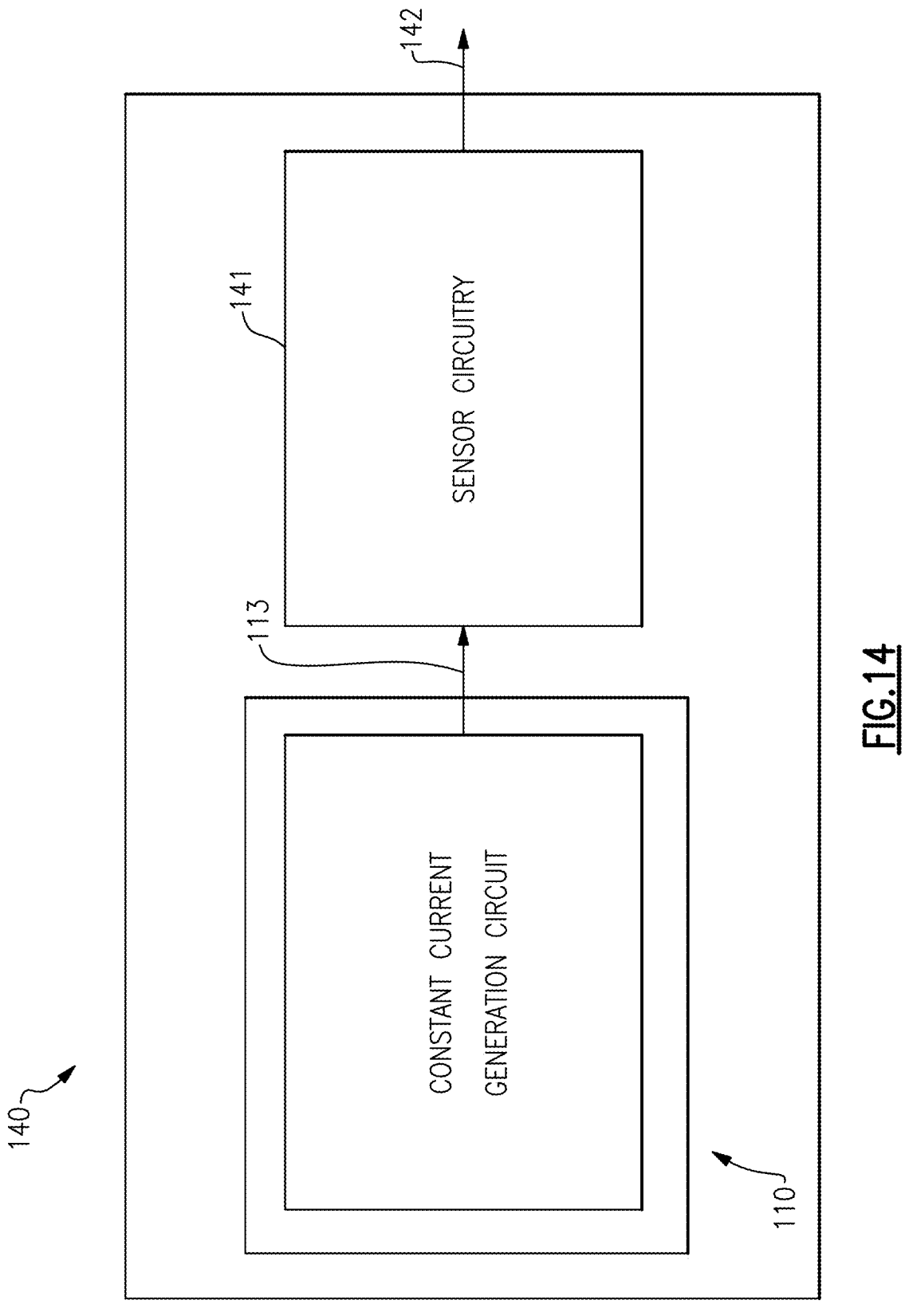
FIG. 14 is an illustration of an exemplary sensor system according to aspects of the present invention.

FIG. 14 shows a system similar to the systems of FIGS. 12 and 13 illustrating that the circuit according to aspects of the present invention can be implemented in a system other than a RF amplification system. In particular, in FIG. 14 the system is a sensor system 140 in which the constant current generation circuit assembly 110, which may be any of the circuits discussed according to aspects of the present disclosure, generates an output current 113, and passes this to sensor circuitry 141 to act as a bias or reference current against which sensing operations may be performed to generate an improved output 142. It will be appreciated that other applications of the current generation circuit will readily occur to those skilled in the art.

Figure 15:
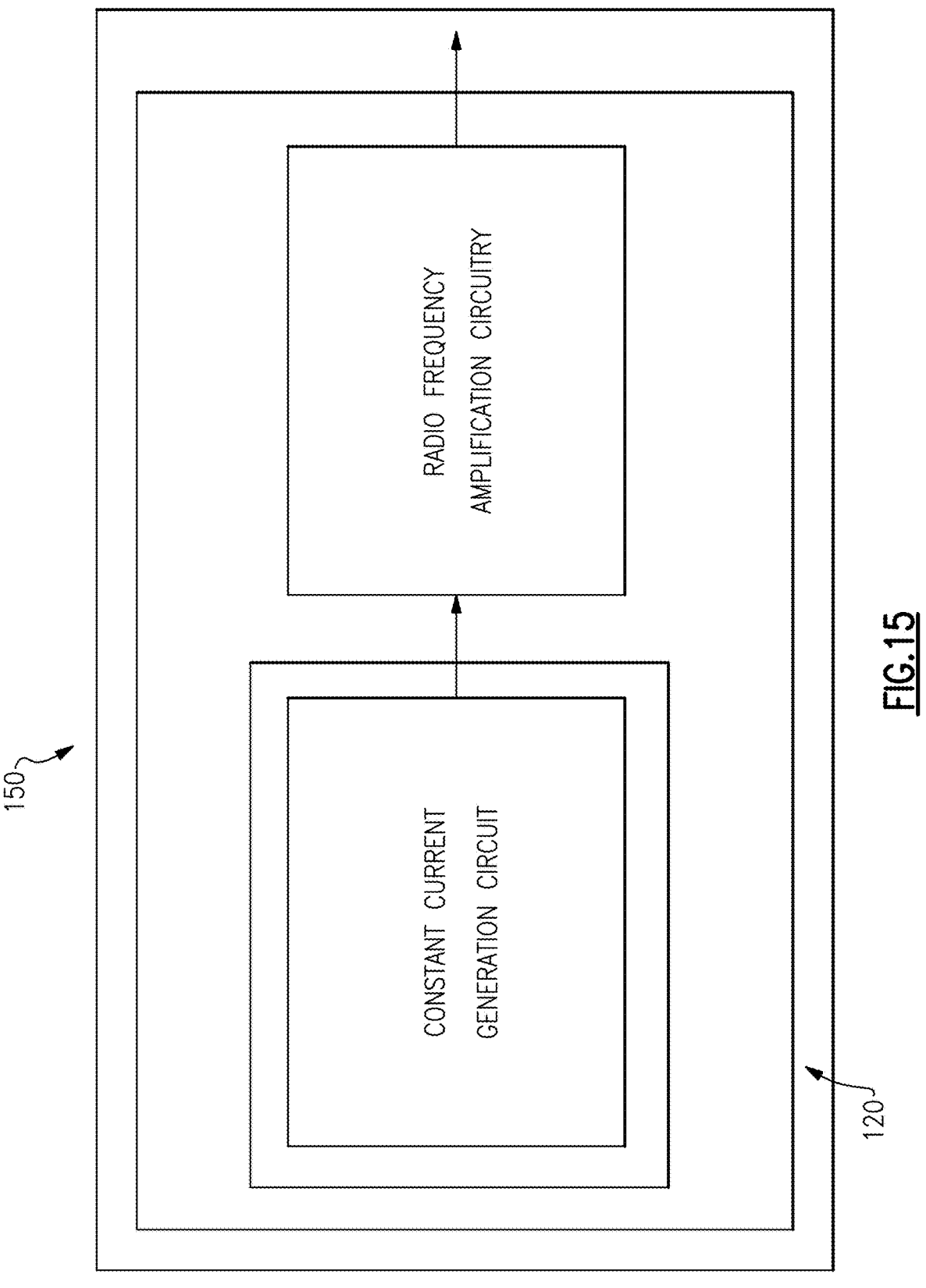
FIG. 15 is an illustration of an exemplary mobile device comprising a radio frequency amplifier system according to aspects of the present invention.
Figure 16:
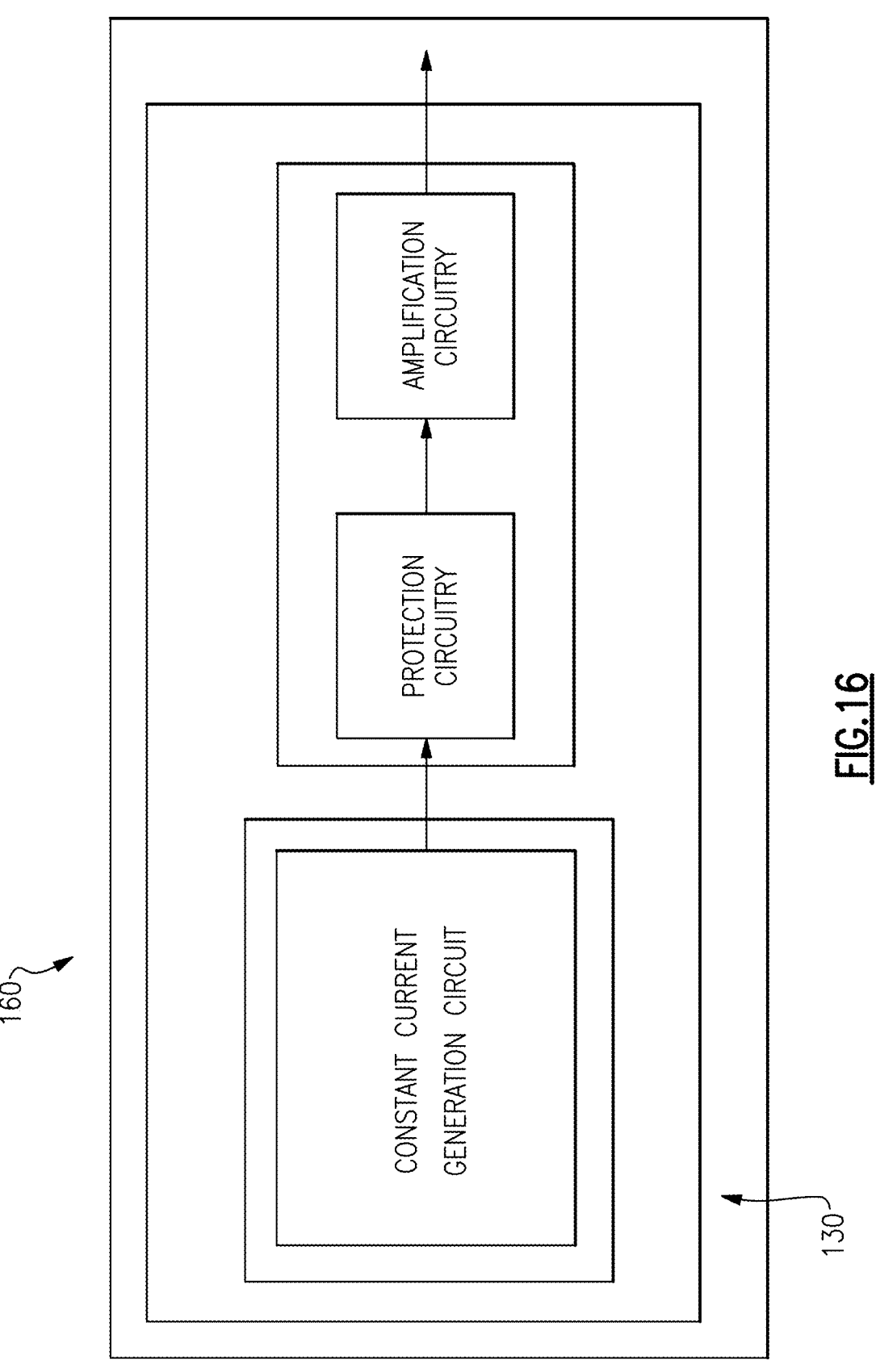
FIG. 16 is an illustration of an exemplary mobile device comprising a radio frequency amplifier system according to aspects of the present invention.
Figure 17:
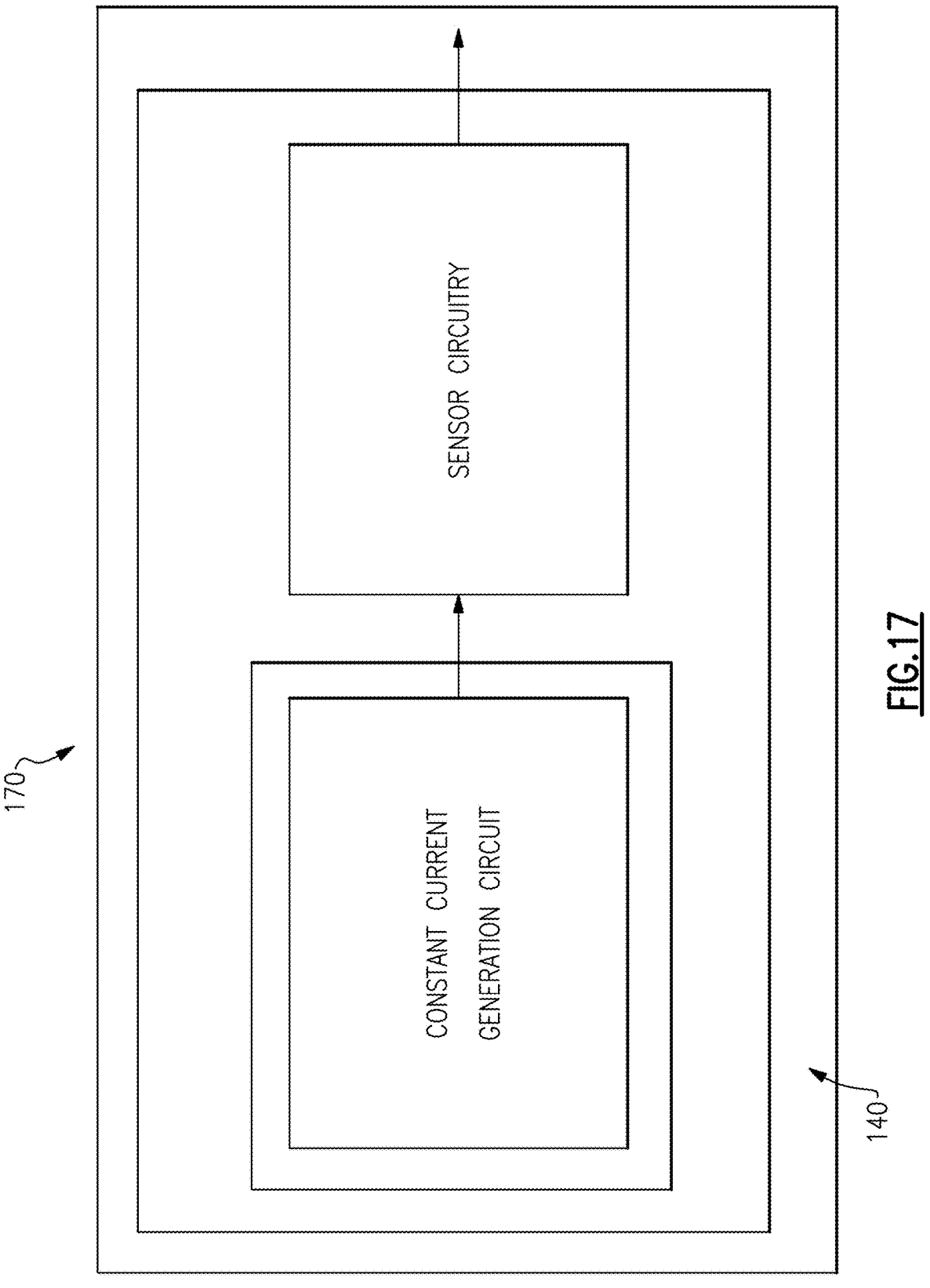
FIG. 17 is an illustration of an exemplary mobile device comprising sensor system according to aspects of the present invention.

FIGS. 15, 16 and 17 show, respectively, the system 120 of FIG. 12, the system 130 of FIG. 13, and the system 140 of FIG. 14 integrated into mobile devices 150, 160 and 170. For example, FIG. 15 shows the mobile device 150 comprising the RF system 120 described in relation to FIG. 12. FIG. 16 shows the mobile device 160 comprising the RF system 130 described in relation to FIG. 13. FIG. 17 shows the mobile device 170 comprising the sensing system 140 described in relation to FIG. 14.

Although arrangements have been shown in which the constant current generation circuit assembly is shown as being disposed on a single self-contained die, other arrangements are possible. For example, the constant current generation circuitry and the RF/sensing circuitry may be implemented on the same die, or the constant current generation circuitry is implemented on more than one die, or the constant current generation circuitry may be implemented in another way that does not involve a die at all, which means that the RF and sensing systems, and the mobile devices may comprise the constant current generation circuit but not the die. Other uses for the circuit according to aspects of the present disclosure are envisaged. Thus, the constant current generation circuit may be integrated into a mobile device on its own (i.e. not as part of an RF amplification or sensing system) or as part of a system other than that of RF amplification or sensing.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A method for generating a constant current, the method comprising:

receiving an input voltage at a voltage input connected to a resistor pair, the resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair; and applying the input voltage to the resistor pair to generate a current with a zero temperature coefficient;

measuring a variation in the current generated by the input voltage and the resistor pair;

determining that one or more further resistors have a resistance that, if connected to the input voltage and the resistor pair, would trim the variation in the current produced by the process variation of the resistor pair; and connecting the one or more further resistors to the input voltage and the resistor pair.

2. The method of claim 1 wherein the variability of resistance over temperature of the first resistor is based on a resistance of the first resistor and the positive temperature coefficient, and the variability of resistance over temperature of the second resistor is based on a resistance of the second resistor and the negative temperature coefficient.

3. The method of claim 2 wherein the resistance and the positive temperature coefficient of the first resistor and the resistance and the negative temperature coefficient of the second resistor are such that the variability in resistance over temperature of the first resistor and the variability in resistance over temperature of the second resistor cancel.

4. The method of claim 3 wherein the resistance of the first resistor and the resistance of the second resistor are chosen such that the positive temperature coefficient of the first resistor is equal in magnitude to the negative temperature coefficient of the second resistor, but opposite in polarity, such that the positive temperature coefficient of the first resistor and the negative temperature coefficient of the second resistor cancel to produce the zero temperature coefficient for the resistor pair.

5. The method of claim 1 further comprising configuring the resistor pair such that the resistor pair has a zero temperature coefficient, the configuring including:

varying the resistance of the first resistor and the resistance of the second resistor until the variability of resistance over temperature of the first resistor and the variability of resistance over temperature of the second resistor cancel; and selecting as the first resistance for the first resistor and the second resistance for the second resistor the resistance of the first resistor and the resistance of the second resistor that results in the cancellation of the variability of resistance over temperature of the first resistor and the variability of resistance over temperature of the second resistor.

6. The method of claim 1 wherein the current is generated by the input voltage being divided by the resistance of the resistor pair.

7. The method of claim 1 wherein the first resistor and the second resistor are arranged in series.

8. The method of claim 1 wherein the first resistor and the second resistor are arranged in parallel.

9. The method of claim 1 wherein the voltage input is a bandgap voltage input and the input voltage is a bandgap voltage.

10. The method of claim 1 wherein the resistance of the one or more further resistors is set so that one or more bits of a bit value of output current that includes the variation are trimmed so as to trim the variation in the current produced by the process variation of the resistor pair.

11. The method of claim 1 wherein the one or more further resistors are connected to the input voltage and the resistor pair by a switch.

12. The method of claim 1 further comprising providing the voltage input and the resistor pair on a die.

13. A method for operating a radio frequency amplifier, the method comprising:

receiving an input voltage at a voltage input connected to a resistor pair, the resistor pair including a first resistor and a second resistor, the first resistor having a positive temperature coefficient and the second resistor having a negative temperature coefficient, the first and second resistors being configured such that a variability of resistance over temperature of the first resistor and a variability of resistance over temperature of the second resistor cancel to produce a zero temperature coefficient for the resistor pair;

applying the input voltage to the resistor pair to generate a current with a zero temperature coefficient;

measuring a variation in the current generated by the input voltage and the resistor pair;

determining that one or more further resistors have a resistance that, if connected to the input voltage and the resistor pair, would trim the variation in the current produced by the process variation of the resistor pair;

connecting the one or more further resistors to the input voltage and the resistor pair; and using the generated current to operate a radio frequency amplifier.

14. The method of claim 13 further wherein using the generated current to operate a radio frequency amplifier includes using the generated current as a bias current for a radio frequency amplifier.

15. The method of claim 13 wherein using the generated current to operate a radio frequency amplifier includes using the generated current as a bias current for protection circuitry for a radio frequency amplifier.

16. The method of claim 13 wherein using the generated current to operate a radio frequency amplifier includes using the generated current to set a reference voltage for a radio frequency amplifier.

17. The method of claim 13 wherein using the generated current to operate a radio frequency amplifier includes using the generated current to set a reference voltage for protection circuitry for a radio frequency amplifier.

18. The method of claim 13 wherein the current is generated by the input voltage being divided by the resistance of the resistor pair.

19. The method of claim 13 wherein the first resistor and the second resistor are arranged in series.

20. The method of claim 13 wherein the first resistor and the second resistor are arranged in parallel.

*     *     *     *     *